Figure 1:
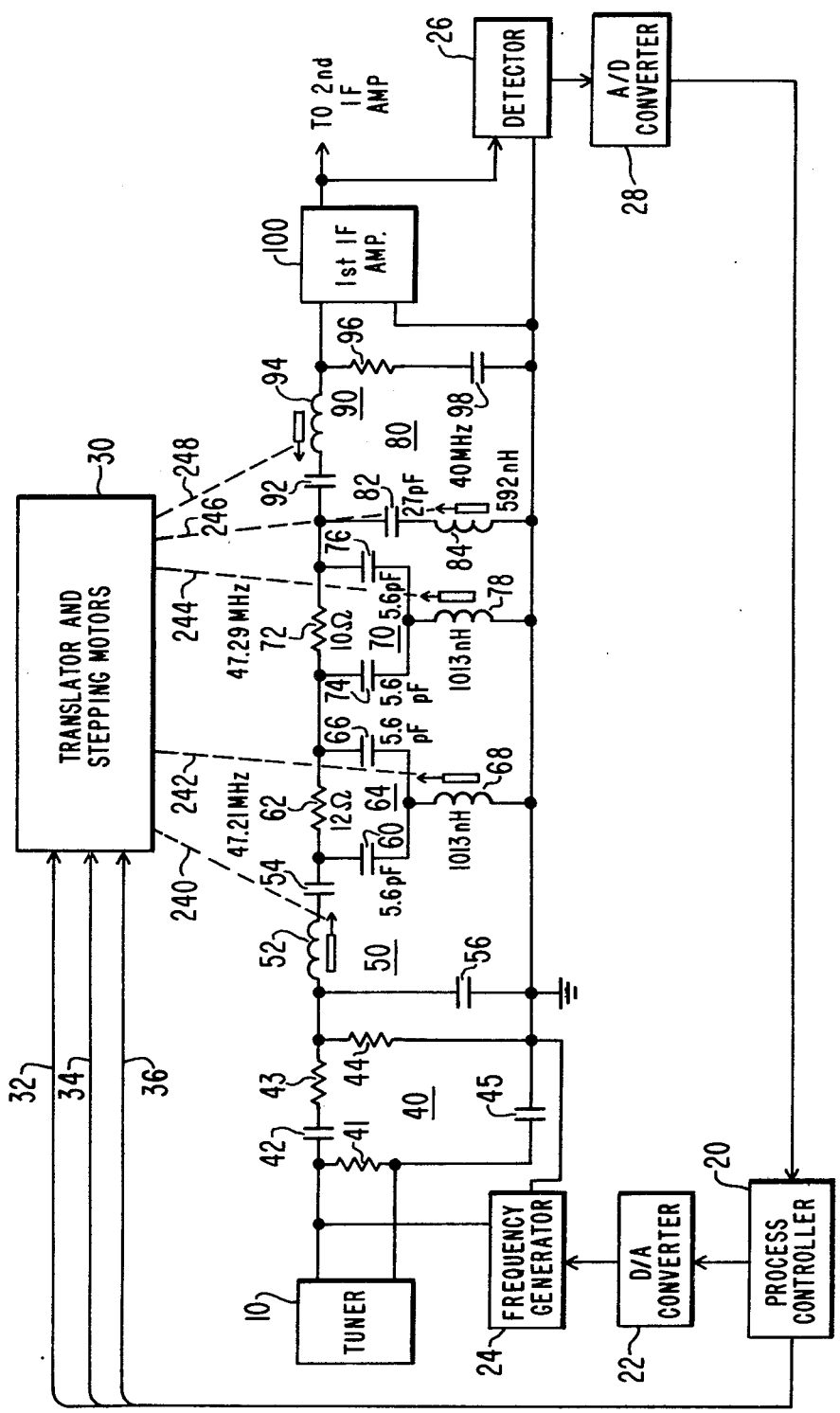

United States Patent [19]

Evans

[11] 4,272,743
[45] Jun. 9, 1981

[54] METHOD FOR TUNING A FILTER CIRCUIT

[75] Inventor: Robert M. Evans, Ringoes, N.J.

[73] Assignee: RCA Corporation, New York, N.Y.

[21] Appl. No.: 32,026

[22] Filed: Apr. 20, 1979

[51] Int. Cl.³ .......................... H03H 3/00; H03H 7/01
[52] U.S. Cl. .................................. 333/176; 333/17 R; 333/168
[58] Field of Search ..................... 333/17 R, 167–171, 333/174–180; 330/2; 358/37–39, 903, 904; 324/78 R, 78 N, 78 E, 78 D

[56] References Cited

U.S. PATENT DOCUMENTS

| 2,978,646 | 4/1961 | Shumard | 330/2 |
| 2,978,647 | 4/1961 | Lehmann | 330/2 |
| 2,978,655 | 4/1961 | Fernsler | 330/2 X |
| 3,484,707 | 12/1969 | Iwahara | 330/2 |
| 3,519,737 | 7/1970 | Marsh, Jr. | 333/177 X |
| 3,652,938 | 3/1972 | Byers et al. | 333/17 R X |

Primary Examiner—Marvin L. Nussbaum

Attorney, Agent, or Firm—E. M. Whitacre; W. H. Meagher; W. B. Yorks, Jr.

[57] ABSTRACT

A method of tuning a trap circuit to a desired frequency is provided. A constant amplitude signal is applied to the trap circuit in a progression of successively different frequency increments. The frequency increments cover a frequency range including the desired frequency. The amplitude of the signal, as modified by the trap circuit is detected and stored at each of the different frequency increments. Successive ones of the stored amplitude values are compared until an amplitude difference is found which is greater than a predetermined minimum difference and is of a polarity indicative of an increase in amplitude with the progression, and is a successor of an amplitude difference which is greater than the predetermined minimum difference and of a polarity indicative of a decrease in amplitude with the progression. The frequency at which the inflection point occurs, as indicated by the two-named amplitude differences, represents the null frequency of the trap circuit. The trap circuit is then tuned to align the null frequency with the desired tuning frequency.

8 Claims, 11 Drawing Figures

METHOD FOR TUNING A FILTER CIRCUIT

This invention relates to a method for tuning a filter circuit to a desired frequency, and may illustratively be used in the computer-controlled alignment of filter circuits during the assembly and adjustment of a television receiver.

Filter circuits are commonly used in television receivers to attenuate or maximize signals of specific frequencies. The filter circuits can be tuned to specific frequencies by adjusting the position of a core of an adjustable inductor which comprises the tuning element of the circuit. In this manner, the frequency at which a filter provides maximum or minimum attenuation is set to a specific signal frequency.

A filter circuit may be characterized mathematically by a transfer function containing poles and zeros. These poles and zeros are related to maximum points (i.e., minimum attenuation) and minimum points (i.e., maximum attenuation) in the characteristic response curve of the circuit. For instance, a simple series resonant L-C circuit in shunt with a signal path will have a transfer function with a zero, which defines a point of maximum attenuation, or null point, in the response characteristic. Likewise, a simple parallel resonant circuit in shunt with a signal path will have a transfer function with a pole, which defines a point of maximum impedance or minimum attenuation in the response characteristic. When an inductor in a filter circuit is adjusted, the frequency locations of the poles and zeroes of the circuit are effectively adjusted to develop the desired response curve for the circuit.

When several filter circuits are coupled together, they may not exhibit a response which is the product of their individual responses, but can interact with each other to develop a response which is characteristic of the unique combination. Thus, tuning one filter circuit in the combination may not merely alter one specific part of the response characteristic, but can affect the frequency locations of numerous poles and zeroes and consequently the overall shape of the response characteristic. Although such a filter combination is susceptible to rigorous mathematical analysis of the filter transfer functions to predict the results of such adjustment, this analysis of often complex and time-consuming. It is usually easier to apply a test signal to a filter combination while the filters are being tuned. The results of the tuning on the test signal are monitored, until a point is reached at which the combination exhibits the desired characteristic response.

This trial and error method of filter circuit tuning may be advantageously employed in the assembly and adjustment of a television receiver. When automated by the use of computer-controlled tuning mechanisms and test signals, complex filter circuits can be quickly and easily adjusted to exhibit a desired response. A complex filter circuit which is adjusted in this manner is the intermediate frequency passband shaping network shown in schematic detail in U.S. patent application No. 032,025, by Gerald E. Theriault, entitled "DOUBLE TRAPPING OF ADJACENT CHANNEL SOUND", filed concurrently herewith. This filter circuit includes two series resonant circuits which shape the passband between the sound and picture carriers. The series resonant circuits are coupled together by two lower adjacent channel sound traps which are tuned to frequencies above and below the nominal frequency of the adjacent channel sound carrier above the frequency location of the desired channel picture carrier, and an upper adjacent channel picture trap which attenuates signals at a frequency below the passband. When properly tuned, these five filter circuits cooperate to shape the intermediate frequency passband.

The two lower adjacent channel sound traps are to be tuned to produce a critically coupled, stagger-tuned response characteristic centered at the frequency location of the adjacent channel sound carrier. As initially assembled, the two traps are randomly tuned to frequencies in the vicinity of the adjacent channel sound carrier frequency, which in this case is 47.25 MHz. The automated alignment system must then locate the two null points of the traps in the frequency spectrum and tune the two circuits to produce the desired response. In order to accomplish this, the system must be able to deal with numerous problematic situations which can develop during the tuning procedure. If one of the traps is initially tuned to a frequency which is close to a pole of another filter circuit, such as that of the series resonant circuit which shapes the passband in the vicinity of the desired channel picture carrier, it will provide less attenuation than the other more distantly-tuned trap circuit. The system must be able to quickly locate the null points of the two traps despite their unequal depth. The system may have inherent nonlinearities in its detection components, which may also introduce errors into the system relating to trap depth and location. Moreover, the test signal will be attenuated in the vicinity of the trap null frequencies by as much as 70 db. The test signal will then be near the noise threshold level of the system, which can produce noise-influenced results during alignment.

When the tuning process is completed, the two traps are not tuned to the same frequency. Instead, one is tuned to a frequency slightly below 47.25 MHz, while the other is tuned to a frequency slightly higher than 47.25 MHz, in order to produce attenuation over a sufficiently wide bandwidth. Consequently, the alignment system must be able to determine which trap is producing which null point, so that the two traps may be tuned in the proper directions through the frequency spectrum. Finally, the alignment system must tune the two traps quickly and efficiently to their desired frequency locations to ensure economical operation of a high volume assembly line.

In accordance with the principles of the present invention, a method of tuning a trap circuit to a desired frequency is provided comprising the steps of:

(a) applying a constant amplitude signal, of successively different frequencies in a progression of frequency increments, over a given frequency range including the desired frequency, to the trap circuit, while (b) detecting the amplitude of the signal as modified by the trap circuit at each of the different frequencies, and (c) sequentially storing the detected amplitudes;

(d) comparing successive ones of the stored amplitudes until an amplitude difference is found which is greater than a predetermined minimum difference and is of a polarity indicative of an increase in amplitude with the progression, and is a successor of an amplitude difference which is greater than the predetermined minimum difference and is of a polarity indicative of a decrease in amplitude with the progression; and (e) adjusting the trap circuit in accordance with the frequency difference between the frequency of inflection indicated by the first named amplitude difference and the desired frequency.

Steps (a) through (d), hereinafter referred to as the slope-search method, will result in the development of the response curve of the filter circuit, despite the presence of noise and nonlinearities in the automated alignment system.

In accordance with a further aspect of the present invention, a method of tuning two cascaded trap circuits to locate their characteristic null frequencies at first and second given frequencies above and below (or below and above) a desired center frequency is provided, comprising the steps of:

(a) tuning the two trap circuits until their null frequencies are located at approximately the desired center frequency;

(b) adjusting one of the trap circuits so as to locate its null frequency at a third frequency above (or below) the first given frequency;

(c) adjusting the other of the trap circuits so as to locate its null frequency substantially at the second given frequency; and (d) adjusting the trap circuit specified in step (b) so as to locate its null frequency substantially at the first given frequency.

In the drawing:

FIG. 1 illustrates, partially in block diagram form and partially in schematic diagram form, apparatus arranged to perform the method of the present invention; and FIGS. 2 through 11 illustrate waveforms explaining the operation of the apparatus of FIG. 1 in accordance with the tuning method of the present invention.

Referring to FIG. 1, a system is shown which automatically tunes five filter circuits. The filter circuits in this example comprise the intermediate frequency passband shaping network of a television receiver as described in the aforementioned copending U.S. Patent application.

A television tuner 10 is coupled to an input attenuator 40. The input attenuator 40 isolates the tuner 10 from subsequent reactive circuit elements, and provides a proper terminating impedance for the tuner. The input attenuator also performs an impedance transformation to match the cable from the tuner 10 to the input impedance of the next stage of reactive elements. In the present example, the input attenuator 40 provides the necessary impedance transformation to match a 50 ohm cable from the tuner to a filter network having an impedance of approximately 40 ohms. The input attenuator 40 consists of a shunt resistor 40, the parallel combination of a capacitor 45 and the serial combination of a capacitor 42 and a resistor 43, and a second shunt resistor 44.

The input attenuator 40 is coupled to a first selectivity network 50, consisting of a capacitor 56 coupled in shunt to ground, and the serial combination of an adjustable inductor 52 and a capacitor 54. The first selectivity network 50 is coupled by two adjacent channel sound traps 60 and 70 and an adjacent channel picture trap 80 to a second selectivity network 90. The second selectivity network 90 consists of the series connection of a capacitor 92 and an adjustable inductor 94, and the series combination of a resistor 96 and a capacitor 98 coupled in shunt to ground. The two selectivity networks cooperate to shape the I.F. passband of the selected television channel. The picture and color carriers are normally located on the upper and lower slopes of the passband response curve and are attenuated by 3 db relative to the center band gain. Adjustable inductors 52 and 94 are adjusted to shape the passband.

The second selectivity network 90 is coupled to a first I.F. amplifier 100. In addition to band shaping the second selectivity network 90 also provides an impedance transformation from a low impedance to a high impedance which better matches the high input impedance of the first I.F. amplifier. An output of the I.F. amplifier 100 is coupled to a second I.F. amplifier (not shown).

Coupled between the first and second selectivity networks 50 and 90 are first and second adjacent channel sound traps 60 and 70. These two traps are each arranged in a bridged-T configuration. The first adjacent channel sound trap 60 is comprised of a resistor 62 coupled in parallel with two capacitors 64 and 66. An adjustable inductor 68 is coupled from the junction of the two capacitors 64 and 66 to ground. The second adjacent channel sound trap 70 is similarly arranged and includes the parallel combination of a resistor 72 and serially coupled capacitors 74 and 76. An inductor 78 is coupled from the junction of the capacitors 74 and 76 to ground.

An upper adjacent channel picture trap 80 is coupld to ground from the junction of the second adjacent channel sound trap 70 and the second selectivity network 90. The adjacent channel picture trap 80 includes the series combination of a capacitor 82 and an inductor 84 coupled to ground. The trap 80 is a high Q trap which is tuned to approximately 40 MHz. Frequencies in the vicinity of this frequency, including the upper adjacent channel picture carrier and many of its sidebands, are severely attenuated by this trap.

The selectivity networks 50 and 90 and the trap circuits 60, 70, and 80 may be tuned to specific frequencies by adjusting the position of cores located in the inductors of the circuits. Each core has a threaded, cylindrical shape and may be screwed up and down through the field in the center of an inductor coil winding, thereby varying the inductance of the inductor. In the trap circuits 60, 70, and 80, moving the core changes the frequency at which the respective trap provides maximum signal attenuation, the null frequency.

Test signals are applied to the filter network by a connection from programmable frequency generator 24 to the input attenuator 40. The frequency generator 24 is controlled to apply constant amplitude test signals in sequential incremental frequency steps over a range of frequencies which includes the tuning frequencies of the filter traps. It is assumed in the following example that the filter traps 60 and 70 will be initially tuned to frequencies in the range of 40 to 50 MHz, which is the frequency generator range in this example.

A detector 26 is coupled to an output of the first I.F. amplifier 100 to detect the amplitudes of the test signals as modified by the filter network. The values of the detected amplitudes are converted from analog form to digital form by an analog-to-digital converter 28. This digital data is then supplied to an input of a process controller 20.

A process controller 20, which may be a general purpose digital computer, controls the tuning process by stepping the frequency generator 24 through its incremental frequency steps. The controller sends a digital signal to a digital-to-analog converter 22, which converts the signal to an analog control voltage and applies it to the frequency generator. In addition, the process controller calculates the adjustments required to tune the filter circuits to the desired frequencies.

After making these calculations, the process controller 20 sends control signals to a translator and stepping motor unit 30 by way of control lines 32, 34, and 36. The translator receives the control signals and activates one of the stepping motors in the unit. The motors adjust the threaded cores of inductors 52, 68, 78, 84, and 94 as indicated by broken lines 240-248. The cores are screwed up and down through the fields in the centers of the inductor coils to adjust the frequencies of the filter circuits. The control signal on line 32 selects one of the inductors and the control signals on lines 34 and 36 determine whether the cores are to be screwed clockwise (down) or counterclockwise (up). If desired, directional control lines for each stepping motor may be provided from the process controller, enabling simultaneous adjustment of the inductors.

The apparatus of FIG. 1 may be implemented to tune filter trap circuits 60 and 70 in the following manner. It is assumed, for purposes of this example, that the two traps are to be tuned to approximately 47.25 MHz and are to be critically coupled so as to exhibit a broad bandwidth, flat-bottomed response curve illustratively shown in FIG. 10. Prior to tuning, the inductor cores are located so that approximately half of the core body is inserted into the upper portion of the coil winding, to a tolerance expressed as a given number of coil turns. When the cores are so located, the inductors are tuned to approximately the center of their adjustment ranges, and each trap circuit will exhibit a response curve with a null point of maximum attenuation located between 40 and 50 MHz in the frequency spectrum. The two traps will exhibit a composite response 150 shown in FIG. 2. The two null points $IMN_L$ and $IMN_H$, are seen to be located above and below 47.25 MHz in this example, but it is understood that the two null points may be located anywhere in the 40 to 50 MHz range.

The first step in the tuning process is to sweep the filter traps with a constant amplitude signal from the frequency generator, 24 over the 40 to 50 MHz range. The frequency generator will perform this function under the control of the process controller 20, in incremental frequency steps, which in this example are 100 KHz. The filter traps will produce output signals of varying amplitudes over the range of sweep frequencies, which are detected by the detector 26, converted to digital data by A/D converter 28, and stored in a sequential array by the process controller. The amplitude data, which is correlated to the frequency steps, is representative of the response curve of the two filter traps.

The process controller next analyzes the data to determine the null points of the two traps. If the filter circuit included only a single filter trap, it is possible that only one null point would be present, which could be easily found by selecting the minimum value of the amplitude data. This cannot be done, however, when two null points are present, as is the case of response curve 150. The two null points, $IMN_L$ and $IMN_H$, can have different amplitudes due to various factors. For instance, the Q's of the trap circuits may differ at their initial frequency settings. The null points are at signal levels which approach the noise level of the system, and may be 70 db lower in amplitude than the test signal. The null points will not be at a fixed frequency location, but will vary slightly in frequency and amplitude with system noise. Also, first I.F. amplifier 100, the detector 26 and the A/D converter 28 may exhibit nonlinear responses and quantizing errors. Furthermore, the trap which produces $IMN_L$ may be adjacent in frequency to a pole of another filter circuit, such as the second selectivity network 90, which shapes the upper edge of the I.F. passband in the television receiver, in the vicinity of the picture carrier (45.75 MHz). In this case, $IMN_L$ would be expected to be at a higher amplitude than $IMN_H$. A minimum point search would consequently locate $IMN_H$ immediately, but the next minimum point could be point 152; and the third minimum point could be point 154, both of which are lower in amplitude than $IMN_L$. Therefore, a more sophisticated method must be used to positively identify $IMN_L$ and $IMH_H$.

Figure 3:
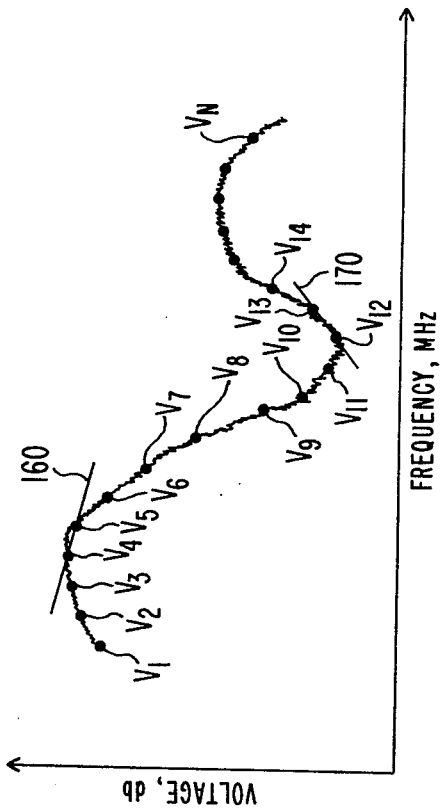

In accordance with the principles of the present invention, a slope search technique is provided for locating the null point of one or more trap circuits. Referring to FIG. 3, the amplitude data is partially shown as a series of points $V_1$ through $V_N$. The process controller operates on these data points by first subtracting $V_1$ from $V_2$, the result of which is representative of the slope of the response over the range of the first frequency step. The result is first compared to a given tolerance value, which in this example is 0.1. If the slope is less than this tolerance, the result is automatically assumed to be noise-influenced and is ignored. If the slope is greater than the tolerance, the result is presumed to be valid, and the sign of the result is examined to determine whether the slope is positive or negative. In this example of FIG. 3, $V_2$-$V_1$ yields a positive slope, which is recorded by the processor.

The data points are then incremented to determine the slope of $V_3$-$V_2$. The foregoing process is repeated for this calculation, and, if the result is valid, the slope is compared with the previous valid slope calculation. If, as in this result, the slope remains the same (i.e., positive), the data points are again incremented and the foregoing process is continued.

It may be seen from FIG. 3 that the process will soon be incremented to data points $V_4$ and $V_5$, which will yield a negative slope result, as shown by slope line 160. The processor will note this slope change and record point $V_4$ as the peak of the response curve, $IMX_L$. Succeeding slope calculations should therefore yield negative results until the null point is passed. Taking this fact into account, the succeeding calculations of $V_7$-$V_6$, $V_8$-$V_7$, et cetera, are reversed and calculated as $V_6$-$V_7$, $V_7$-$V_8$, et cetera, so that the process controller can continue to look for a positive-to-negative sign change of the slope calculation.

Figure 2:
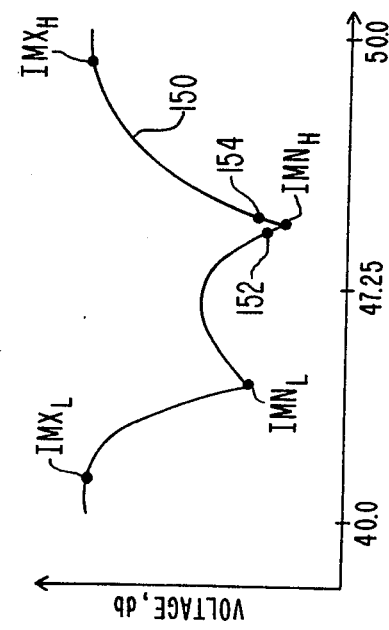

The process continues, until a slope change is noted with the calculation $V_{12}$-$V_{13}$, as indicated by slope line 170. Point $V_{12}$ is then recorded by the process controller as $IMN_L$, the null point of a trap. At this point in the process, the points may again be reversed in the calculation, and the process controller can continue the process to find the next response peak and the second null point. However, in the interests of efficiency, the process controller in the present example halts the slope search at this point, which is termed the low slope search. The process controller then begins a high slope search. This search follows the same procedure as the low slope search, but begins in a descending sequence from the last points recorded, at 50 MHz. Referring to FIG. 2, it may be seen that the high slope search will first find the high frequency peak point $IMX_H$, and then the high frequency null point $IMN_H$. The low and high slope searches have been found to be efficient in practice, because the initial data points analyzed are frequently on the negative slopes which descend into the null points. Thus, $IMX_L$ and $IMX_H$ are often not found since they often do not exist within the 40 to 50 MHz search range. The calculation reversals at these points are therefore omitted. More significantly, $IMN_L$ and $IMN_H$ have been found to be frequently located in the vicinity of 40 MHz and 50 MHz, respectively. The high-low slope search technique will therefore find the null points without the necessity of analyzing the large number of data points located between $IMN_L$ and $IMN_H$.

Figure 4:
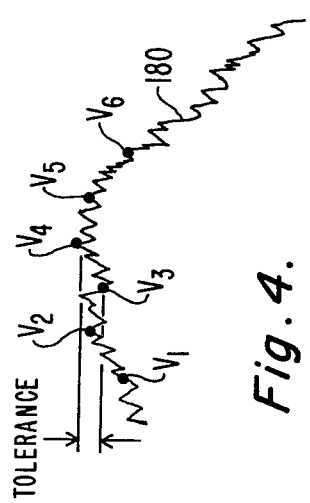

The effect of the slope tolerance comparison is illustrated by FIG. 4, which shows the peak of a waveform 180 containing a significant amount of noise. Without the tolerance comparison, slope calculations would result in $V_2$ being recorded as a peak point, $V_3$ a null point, and $V_4$ a second peak point. In this example however, only the determination that $V_4$ is a peak point is valid; the other two findings are actually noise-induced results. But when the slopes are compared to the tolerance, it can be seen that the calculation $V_3-V_2$ is less than the tolerance and would be ignored as invalid. The next valid comparison would be $V_4-V_3$, which has the same slope sign as $V_2-V_1$. A slope change would not occur until the calculation of $V_5-V_4$ or, if this value does not exceed the tolerance, the calculation of $V_6-V_5$.

At the end of the high and low slope searches, the process controller will have determined the frequency locations of the two null points $IMN_L$ and $IMN_H$ of FIG. 2. The process controller will then proceed to tune both trap circuits 60 and 70 to 47.25 MHz. Since the controller knows the existing frequency locations of the null points, it can calculate how much to move the null points to center them at 47.25 MHz, but it does not know at this point which inductor corresponds with which null point. The controller will nevertheless assume that inductor 68 corresponds to point $IMN_L$ and inductor 78 corresponds to point $IMN_H$, and will proceed to adjust the two inductors accordingly.

The inductors are adjusted by the translator and stepping motor in increments of two hundred steps per core revolution. At this point, each core step is assumed to result in a change of 2.75 KHz in the frequency of the null point of the trap.

Figure 5:
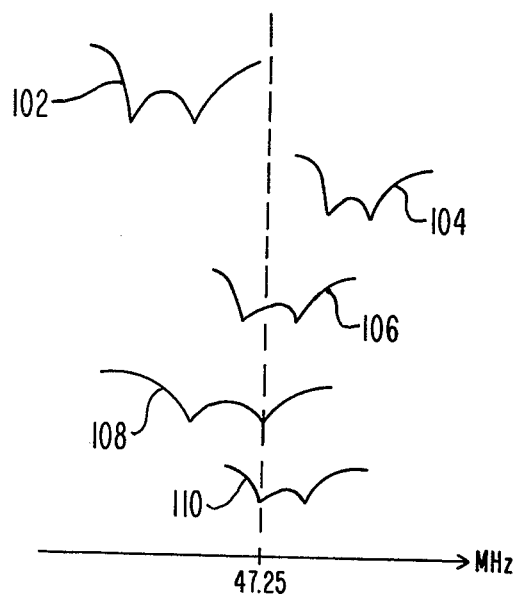

As previously mentioned, the null points can initially be located anywhere in the frequency spectrum of 40 to 50 MHz. Five of these possibilities are illustrated in FIG. 5. Both null points can be located below 47.25 MHz (waveform 102), or both can be located above 47.25 MHz (waveform 104). The null points can be located on either side of 47.25 MHz (waveform 106), or one can be located at 47.25 MHz with the other point being either above (waveform 108) or below (waveform 110) 47.25 MHz. In addition, the lower frequency null point of each possibility can correspond to filter trap 60 and the higher frequency null point to filter trap 70, or the two can be reversed. This ambiguity as to which null point relates to which filter trap means that the five waveforms of FIG. 5 have five complementary waveforms. And, of course, it is possible for both null points to be initially located at 47.25 MHz. Thus, there are eleven possible combinations of null point locations which must be resolved successfully by the automated tuning system.

By proceeding in accordance with the following procedure, the automated tuning system of the present invention will tune the two filter traps to 47.25 MHz without irretrievably tuning one of the filter traps out of the 40 to 50 MHz range. If this were to happen, the null point of the mistuned trap would be beyond the range over which the frequency generator provides null point location information to the system, and that trap could conceivably become lost to the tuning system.

For purposes of the present example, the procedure of the present invention will be explained in conjunction with the tuning of the initial waveform 102 shown in FIG. 5, although it is understood that this procedure can be followed with any of the initial conditions of FIG. 5. After performing a slope search, the process controller will calculate the number of core steps required to tune each of the two traps to 47.25 MHz. In this example, the process controller assumes that one core step results in a change of 2.75 KHz in the location of the null point of a trap. If the number of core steps required exceeds fifty, the core is turned only fifty steps. If the required number of core steps is less than fifty, the core is turned only three-quarters of the required number of steps to prevent the possibility of overshooting 47.25 MHz. If the target frequency is overshot, the two null points will be reversed with respect to their respective filter traps in the subsequently produced response curve if the null points are closing on the target frequency from opposite directions. This would cause the system to mistune the traps away from the target frequency during the next adjustment.

Figure 6:
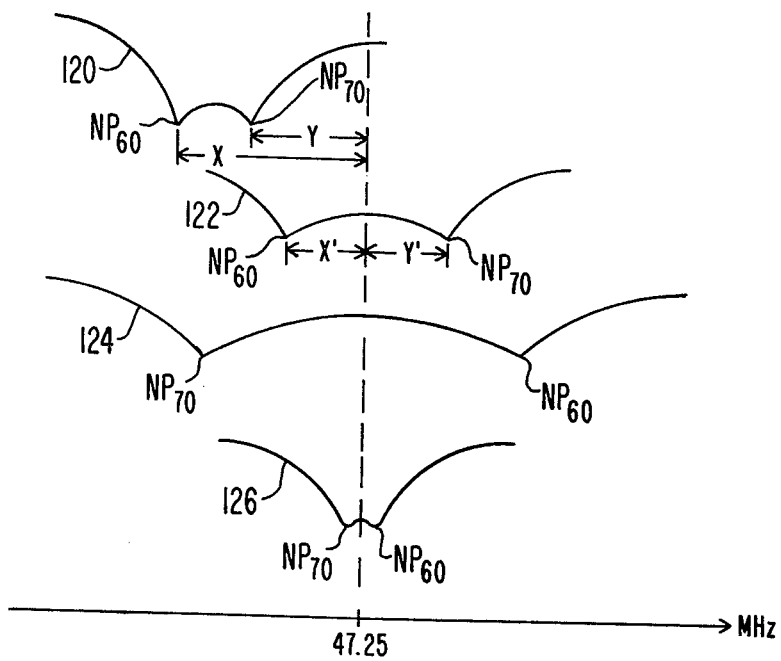

After moving the two traps through one or more fifty step increments, the null points will begin to approach 47.25 MHz, as shown by waveform 120 of FIG. 6. During this time, the system assumes that the lower frequency null point corresponds to filter trap 60, and the upper one to filter trap 70. This assumption may not be correct; and in this example, it is incorrect. It will be seen that the process controller will eventually discover this mistake and will correct it.

When the two null points are located as shown in waveform 120, the system will make a slope search and calculate that $NP_{60}$ of trap 60 must be tuned X steps and $NP_{70}$ of trap 70 must be tuned Y steps to reach the target frequency. The process controller will command the translator and stepping motors to tune the traps accordingly. However, since the assumed correspondence of the inductors to the null points was incorrect, $NP_{60}$ will actually by moved Y steps, and $NP_{70}$ will be moved X steps. This will result in the generation of the response curve of waveform 122 after the next slope search. But since the null points $NP_{60}$ and $NP_{70}$ are located closer to 47.25 MHz then they were in waveform 120, the system does not recognize its mistaken assumption as yet. The process controller now calculates that $NP_{60}$ of trap 60 must be tuned X' steps, and $NP_{70}$ of trap 70 must be tuned Y' steps, and that the cores of the two traps must be adjusted in opposite directions (i.e., clockwise and counterclockwise). The translator and stepping motors are again activated, and since the assumed trap and null point correspondence was wrong, $NP_{60}$ and $NP_{70}$ will move away from 47.25 MHz by Y' and X', respectively. After the next slope search, the system will discover that the two null points have diverged, as shown in waveform 124, and will reverse its assumption. Since the process controller now knows that $NP_{70}$ is the lower frequency null point and $NP_{60}$ the higher of the two, the system can now proceed to converge the two traps on 47.25 MHz, as shown in waveform 126.

Figure 7:
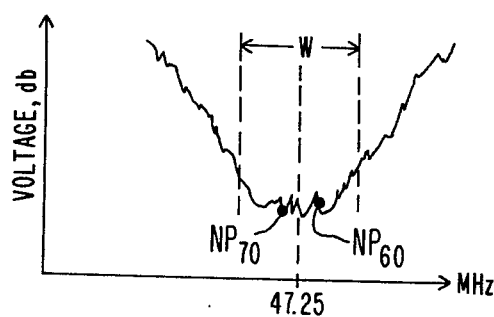

The two traps are tuned until the two null points $NP_{60}$ and $NP_{70}$ are both located within a certain frequency range W (e.g., 180 KHz), centered on 47.25 MHz, as shown in FIG. 7. If the actual core step sizes are greater than the assumed value of 2.75 KHz, further tuning at this point would only cause the two null points to overshoot the target frequency during subsequent tuning steps. The system would then mistakenly tune the two traps in the wrong direction, an error which would again have to be discovered and corrected. To prevent this oscillatory tuning, the process is halted when the two null points are located within the range W.

In the tuning example of FIG. 6, the mistakenly assumed trap and null point correspondence was not corrected until relatively late in the tuning process, after the assumed $NP_{70}$ passed above the center frequency of 47.25 MHz. However, it is possible that the mistaken assumption will be discovered earlier, and may even be corrected after the first tuning adjustment. For instance, if the two traps are initially tuned as illustrated by waveform 106 of FIG. 5, the two traps will diverge from 47.25 MHz after the first tuning adjustment of the assumed correspondence is wrong. The error would then be discovered and corrected at this time. Furthermore, the individual null points can cross over the center frequency several times before tuning is completed, which may create the erroneous correspondence condition several times during the process. However, the method of the present invention will discover all of these errors, correct them, and eventually tune the two traps to the desired center frequency.

The automated tuning system now proceeds to move the two null points to precise frequency locations in order to develop the desired flat-bottomed response curve. The system will no longer mistakenly tune the wrong trap, since they are both tuned to approximately 47.25 MHz. The precision of the system is increased by making minimum point searches, rather than slope change searches. The minimum point search technique will precisely locate the null points of the traps, since the results of the search include the effects of stray reactances on the circuits, which cannot be readily calculated during tuning. The resolution of the system is also increased by incrementing the frequency generator is smaller frequency steps during the search.

Figure 8:
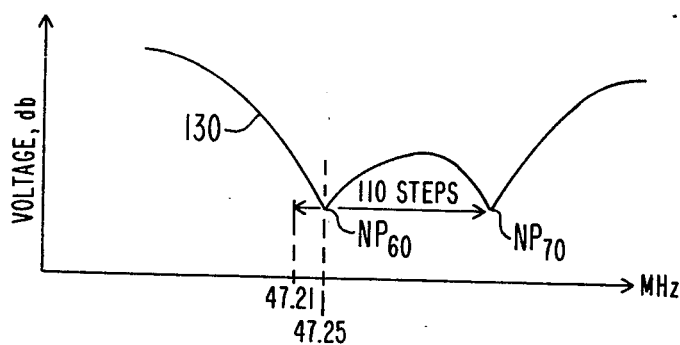
Figure 9:
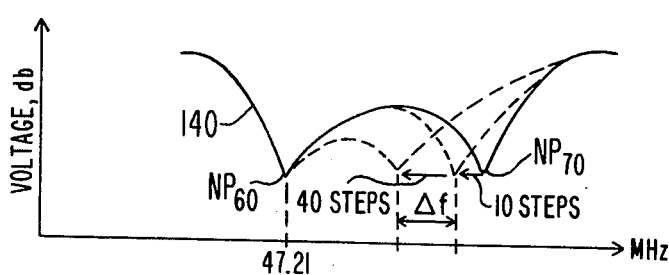
Figure 10:
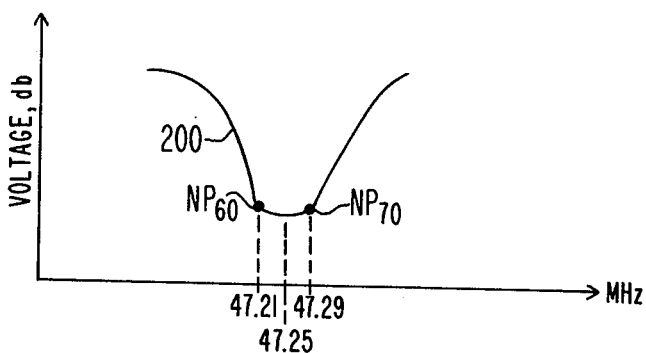

The first step of this final tuning process is to tune trap 70 up in frequency by one hundred and ten steps. The resultant response curve 130 is as shown in FIG. 8. Next, trap 60 is tuned down in frequency until $NP_{60}$ is located at 47.21 MHz. During this tuning step, the frequency generator sweeps only a 400 KHz range, centered on 47.21 MHz, in steps of 5 KHz. This tuning continues until the minimum amplitude point is located at approximately 47.21 MHz, producing response curve 140 of FIG. 9. $NP_{70}$ is now moved to its final frequency location. Trap 70 is first tuned down in frequency by ten core steps. This ten step rotation is necessary in order to take the backlash out of the inductor, since the direction of core rotation is being reversed from the previous one hundred and ten step adjustment upward. A minimum search is now made to determine the precise frequency location of $NP_{70}$. The core of trap 70 is then turned forty steps down in frequency and the frequency location of $NP_{70}$ is again determined by a minimum search. The process controller next calculates the frequency change $\Delta f$ of $NP_{70}$ over this forty step change. The process controller will now calculate exactly how many steps are required to tune the null point of trap 70 to its final frequency location of 47.29 MHz. At this point, the minimum point search technique cannot be used, because the final response curve will have numerous noise-affected minimum points between 47.21 and 47.29 MHz and the resultant data would not determine the precise location of $NP_{70}$. The process controller will thus command the translator and stepping motors to turn the core of trap 70 the number of steps calculated to locate $NP_{70}$ at 47.29 MHz, thereby producing the response curve 200 of FIG. 10.

Figure 11:
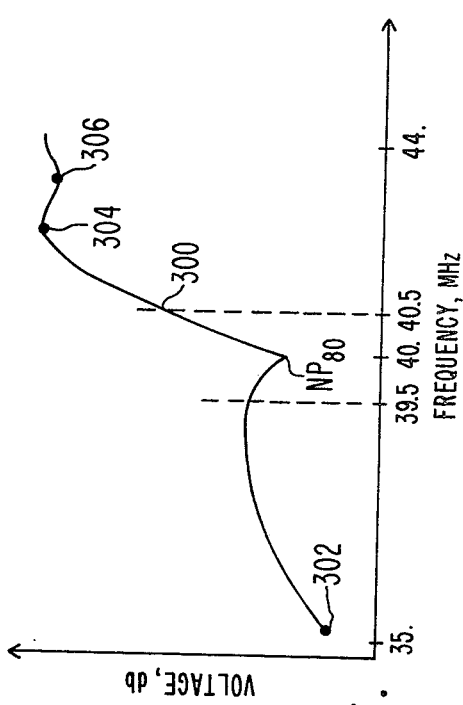

In accordance with a further aspect of the present invention, the aforedescribed method is modified to tune a single trap circuit, such as the 40 MHz adjacent channel picture carrier trap 80 of FIG. 1. A typical waveform 300 containing the null point $NP_{80}$ of trap 80 is shown in FIG. 11. $NP_{80}$ can initially be located anywhere within the frequency range of 35 to 44 MHz, which is the frequency range swept by the frequency generator 24. As in the case of the double traps, a minimum search cannot be used to locate $NP_{80}$, since the search results may show a minimum amplitude point at the lower end of the frequency range, as indicated by point 302. The search results may also show a second minimum point 306 located at a frequency higher than that of $NP_{80}$. This minimum point 306 is caused by the adjacent location 304 of a pole of the first selectivity network 50, which may not as yet have been properly tuned. $NP_{80}$ is located by a low slope search, starting at 35 MHz, which prevents the discovery of minimum point 306 before $NP_{80}$ is found. The low slope search is conducted in frequency steps of 0.25 MHz and, as before, amplitude differences are compared to a minimum tolerance value and invalid difference values are disregarded. The low slope search is halted when a negative-to-positive slope transition occurs, in the vicinity of $NP_{80}$. Once $NP_{80}$ has been found, the process controller determines the adjustment necesary to locate the null point at the desired frequency of 40 MHz. The core of inductor 84 is rotated in the proper direction to tune the trap, limited as before to a maximum of 50 steps. During subsequent slope searches and adjustments, $NP_{80}$ will begin to close in on 40 MHz. This process of slope searching and adjusting is halted when $NP_{80}$ is located within a first frequency range extending from 30.5 to 40.5 MHz.

Once $NP_{80}$ is located in the first frequency range, this range is swept by the frequency generator 24 and sampled in increments of 25 KHz to find the minimum amplitude point in the range. This minimum search is followed by a tuning adjustment, and the process is repeated until the minimum amplitude point is located in a second frequency range extending from 39.9 to 40.1 MHz. When this occurs, the adjacent channel picture trap is satisfactorily tuned, and the system can proceed to align the selectivity networks 50 and 90.

What is claimed is:

1. A method of tuning a trap circuit to locate the frequency at which the trap provides maximum attenuation at a desired frequency comprising the steps of:
    (a) applying a constant amplitude signal, of successively different frequencies in a progression of frequency increments, over a given frequency range including said desired frequency, to said trap circuit, while
    (b) detecting the amplitude of said signal as modified by said trap circuit at each of said different frequencies, and
    (c) sequentially storing said detected amplitudes;
    (d) comparing successive ones of said stored amplitudes until an amplitude difference is found which is greater than a predetermined minimum difference and is of a polarity indicative of an increase in amplitude with said progression, and is a successor of an amplitude difference which is greater than said predetermined minimum difference and is of a polarity indicative of a decrease in amplitude with said progression; and (e) adjusting said trap circuit in accordance with the frequency difference between the frequency of inflection indicated by said first named amplitude difference and said desired frequency.

2. A method of tuning two cascaded trap circuits to locate their respective characteristic null frequencies at first and second given frequencies above and below a desired center frequency comprising the steps of:

(a) tuning said two trap circuits until their null frequencies are located at approximately said desired center frequency;

(b) adjusting one of said trap circuits so as to locate the null frequency of said one trap circuit at a third frequency above said first given frequency;

(c) adjusting the other of said trap circuits so as to locate the null frequency of said other trap circuit substantially at said second given frequency; and (d) adjusting said one trap circuit so as to locate said null frequency of said one trap circuit substantially at said first given frequency.

3. The method of claim 2, wherein step (a) comprises the steps of:

(a1) applying a constant amplitude signal, of successively different frequencies in a progression of frequency increments, over a given range of frequencies including said desired center frequency, to said trap circuits, while (a2) detecting the amplitude of said signal, as modified by said trap circuits, at each of said different frequencies, and (a3) sequentially storing said detected amplitudes;

(a4) comparing said stored amplitudes to determine the respective null frequencies of said two trap circuits; and (a5) adjusting said two trap circuits in accordance with the frequency differences between said null frequencies and said desired center frequency so as to locate both of said null frequencies at approximately said desired center frequency.

4. The method of claim 2, wherein step (c) comprises the steps of:

(c1) applying a constant amplitude signal, of successively different frequencies in a progression of frequency increments, over a given range of frequencies which includes said desired center frequency and said second given frequency, while (c2) detecting the amplitude of said signal as modified by said trap circuits, at each of said different frequencies; and (c3) sequentially storing said detected amplitudes;

(c4) adjusting the other of said trap circuits in accordance with the difference between said second given frequency and the frequency at which said detected amplitudes exhibits a minimum value.

5. The method of claim 2 or 4, wherein step (d) comprises the steps of:

(d1) adjusting said one trap circuit to a fourth frequency which is lower than said third frequency and higher than said first given frequency;

(d2) adjusting said one trap circuit to a fifth frequency which is lower than said fourth frequency and higher than said first given frequency;

(d3) adjusting said one trap circuit so as to locate said null frequency of said one trap circuit substantially at said first given frequency in accordance with the difference between said fifth frequency and said first given frequency, on the basis of the adjustment of said one trap circuit from said fourth to said fifth frequency.

6. The method of claim 3, wherein step (a4) comprises the steps of:

(a4-1) comparing successive ones of said detected amplitudes, beginning with the first stored amplitude, until an amplitude difference is found which is greater than a predetermined minimum difference and is of a polarity indicative of an increase in amplitude with said progression, and is a successor of an amplitude difference which is greater than said minimum difference and is of a polarity indicative of a decrease in amplitude with said progression; and (a4-2) comparing successive ones of said detected amplitudes in reverse of the order of step (a4-1), beginning with the last stored amplitude, until an amplitude difference is found which is greater than a predetermined minimum difference and is of a polarity indicative of an increase in amplitude with said reverse order succession, and is a successor of an amplitude difference which is greater than said minimum difference and is of a polarity indicative of a decrease in amplitude with said reverse order succession; and wherein step (a5) comprises adjusting said two trap circuits in accordance with the corresponding frequency difference between the frequency of inflection indicated by said first named amplitude difference of step (a4-1) and said desired center frequency, and the frequency difference between the frequency of inflection indicated by said first named amplitude difference of step (a4-2) and said desired center frequency, respectively.

7. The method of claim 6, wherein step (a5) comprises adjusting each of the respective trap circuits by:

(1) a first predetermined frequency increment if the corresponding frequency difference is greater than said first predetermined frequency increment, and (2) less than the corresponding frequency difference if the frequency difference is equal to or less than said first predetermined frequency increment and greater than a second predetermined frequency increment which is smaller than said first predetermined frequency increment.

8. The method of claim 3, wherein step (a5) comprises the steps of:

(a5-1) adjusting one of said trap circuits in repetitive incremental frequency steps in accordance with the frequency difference between the current value of one of said null frequencies and said desired center frequency, while adjusting the other of said trap circuits in repetitive incremental frequency steps in accordance with the frequency difference between the current value of the other of said null frequencies and said desired center frequency, while determining updated respective null frequencies after each of said incremental steps, until said respective null frequencies are located within a second given frequency range including said desired center frequency or until one of said frequency differences increases after an incremental adjustment, as compared with the previous respective frequency difference, and, in the instance of said increase;

(a5-2) adjusting said other of said trap circuits in repetitive incremental frequency steps in accordance with the frequency difference between the current value of said one of said null frequencies and said desired center frequency, while adjusting said one of said trap circuits in repetitive incremental frequency steps in accordance with the frequency difference between the current value of said other of said null frequencies and said desired center frequency, while determining respective updated null frequencies for said two trap circuits after each of said incremental steps, until and two null frequencies are located within said second given frequency range, or until one of said frequency differences increases after an incremental adjustment, as compared with the previous respective frequency difference, and, in the instance of said latter increase, repeating step (a5-1).

* * * * *